US007634324B2

(12) United States Patent  
Smith (10) Patent No.: US 7,634,324 B2
(45) Date of Patent: Dec. 15, 2009

(54) METHOD AND SYSTEM FOR ALIGNING AND LAYING OUT DRAWING ELEMENTS IN CAD DRAWINGS

(75) Inventor: Toby S. Smith, Deering, NH (US)

(73) Assignee: Autodesk, Inc., San Rafael, CA (US)

( * ) Notice: Subject to any disclaimer, the term of this patent is extended or adjusted under 35 U.S.C. 154(b) by 252 days.

(21) Appl. No.: 11/622,301

(22) Filed: Jan. 11, 2007

(65) Prior Publication Data

US 2008/0172605 A1 Jul. 17, 2008

(51) Int. Cl.
*G06F 19/00* (2006.01)
*G06F 17/00* (2006.01)
*G05B 19/18* (2006.01)
*G06T 11/20* (2006.01)
*G09G 5/00* (2006.01)

(52) U.S. Cl. .................. 700/103; 700/57; 715/204; 715/243; 345/440; 345/441; 345/651; 345/662; 345/677

(58) Field of Classification Search .................. 700/90, 700/97, 98, 103, 57; 715/200, 201, 204, 715/211, 243–245; 345/418, 419, 427, 440, 345/441, 619, 676, 677, 651, 662

See application file for complete search history.

(56) References Cited

U.S. PATENT DOCUMENTS

| | | | | |
|---|---|---|---|---|
| 5,123,087 A | | 6/1992 | Newell et al. | |
| 5,198,986 A | * | 3/1993 | Ikeda et al. | 716/5 |
| 5,412,877 A | * | 5/1995 | McKendrick | 33/567 |
| 5,640,497 A | * | 6/1997 | Woolbright | 716/11 |
| 6,049,340 A | * | 4/2000 | Matsushita et al. | 345/441 |
| 6,189,132 B1 | * | 2/2001 | Heng et al. | 716/11 |
| 7,068,288 B1 | * | 6/2006 | Good et al. | 345/619 |
| 7,098,933 B1 | * | 8/2006 | Thoemmes et al. | 345/677 |
| 7,272,789 B2 | * | 9/2007 | O'Brien | 715/247 |
| 7,290,242 B2 | * | 10/2007 | Juengling | 716/21 |
| RE39,950 E | * | 12/2007 | Gantt et al. | 345/651 |
| 7,333,868 B2 | * | 2/2008 | Trammell et al. | 700/97 |

(Continued)

FOREIGN PATENT DOCUMENTS

| | | | |
|---|---|---|---|
| JP | 02278465 A | * | 11/1990 |
| JP | 04115367 A | * | 4/1992 |
| JP | 05204899 A | * | 8/1993 |

OTHER PUBLICATIONS

International Search Report. Jul. 11, 2008.

*Primary Examiner*—Crystal J Barnes-Bullock
(74) *Attorney, Agent, or Firm*—Patterson & Sheridan, LLP (57) ABSTRACT

Embodiments of the invention include a method for aligning and laying out drawing elements in a computer-aided design drawing and computer-readable medium storing instructions for implementing the method. Specifically, one embodiment of the present invention sets forth a method, which includes the steps of receiving a selection of an insertion point on an object within the CAD drawing, where the drawing element attaches to the object at the insertion point, placing the drawing element at the insertion point, and orienting the drawing element at a predetermined alignment angle relative to the object.

19 Claims, 9 Drawing Sheets

U.S. PATENT DOCUMENTS

| | | | |
|---|---|---|---|
| 2002/0029219 A1* | 3/2002 | Mulzer | 707/101 |
| 2002/0035408 A1 | 3/2002 | Smith | |
| 2003/0085887 A1* | 5/2003 | Hunt et al. | 345/418 |
| 2005/0081161 A1 | 4/2005 | MacInnes et al. | |
| 2005/0256693 A1 | 11/2005 | Meisenecker | |
| 2006/0185275 A1* | 8/2006 | Yatt | 052/236.1 |

* cited by examiner

METHOD AND SYSTEM FOR ALIGNING AND LAYING OUT DRAWING ELEMENTS IN CAD DRAWINGS

BACKGROUND OF THE INVENTION

1. Field of the Invention

The present invention generally relates to computer software. More specifically, the present invention relates to a method and system for aligning and laying out drawing elements in CAD drawings.

2. Description of the Related Art

The term computer-aided design (CAD) generally refers to a broad variety of computer-based tools used by architects, engineers, and other construction and design professionals. In the development of residential and commercial building designs, one common and time-consuming task is the layout of drawing elements representing electrical devices and light fixtures, in a CAD drawing. Specifically, drawing elements representing these objects need to be positioned in specific ways relative to other elements in the CAD drawing in order for the CAD drawing to correctly represent the design of a building. Examples of the other drawing elements include lines, arcs, walls, and ceiling grids. Further, the design of the building may also need to conform to various building standards or building codes, and the positioning of the drawing elements needs to satisfy any such requirements. Using existing CAD programs, design professionals are burdened with having to manually perform certain steps, which are further discussed in subsequent paragraphs, to individually layout and orient each of the drawing elements. In addition, if the boundaries of the objects are not straight lines but instead are, for instance, curved lines, then even more steps are needed to achieve proper alignment of the drawing elements representing electrical devices.

Figure 1A:
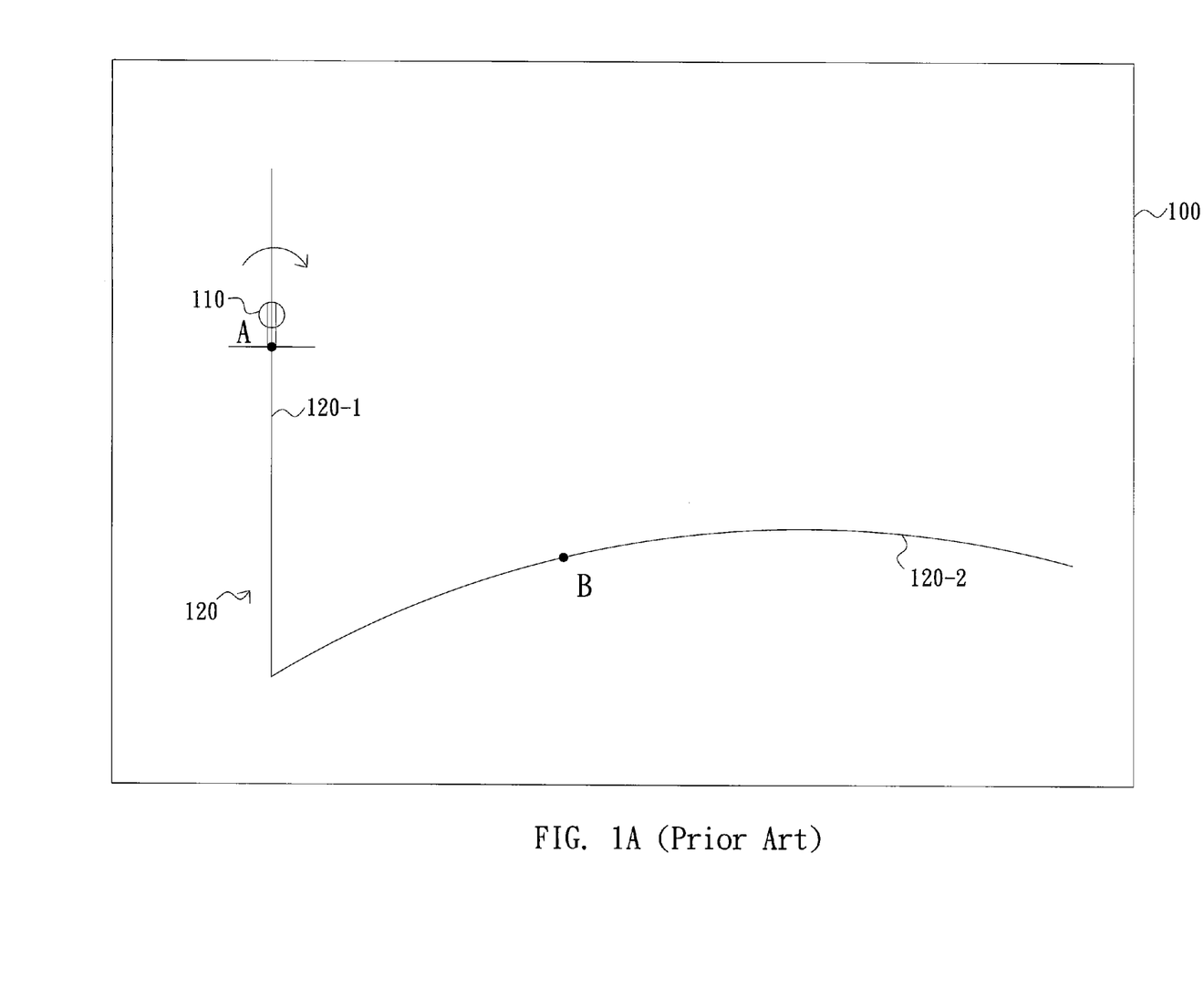
FIG. 1A and FIG. 1B are schematic diagrams of prior art approaches of adding and placing a receptacle in a CAD drawing.
Figure 1B:
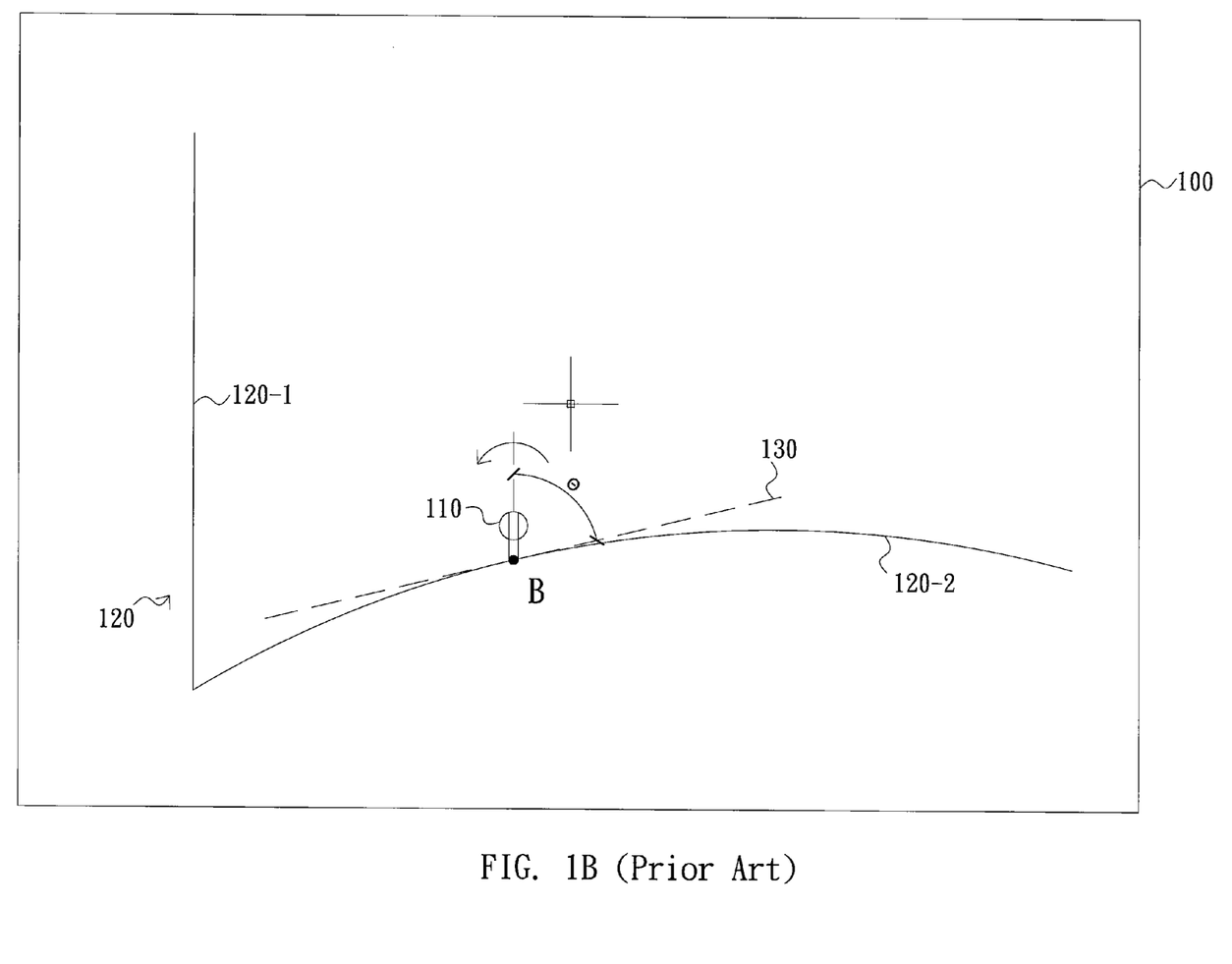

To illustrate, FIG. 1A and FIG. 1B are schematic diagrams setting forth prior art approaches of adding and placing a drawing element representation of a receptacle in a CAD drawing. In particular, FIG. 1A shows the placing of a receptacle 110 at a point A in a viewing screen 100, which displays a part of a CAD drawing. The viewing screen 100 includes a wall 120, which has a straight section 120-1 and a curved section 120-2. In a prior art CAD program, adding and placing the receptacle 110 at the point A requires a user of the program to perform these following steps: (1) select the receptacle 110, and then (2) direct it to the point A on the straight section 120-1. If the user intends to align the receptacle 110 perpendicularly to the straight section 120-1, then the user needs to perform additional steps of specifying a right angle and invoking a function to rotate the receptacle 110 ninety (90) degrees in a clockwise manner. Alternatively, via the graphical user interface of the prior art CAD program, the user can manually rotate the receptacle 110, visually determine whether the intended orientation for the receptacle 110 is achieved, and repeat the rotation and visual determination steps until the desired results are reached.

Further complicating the process, if the user instead intends to place the receptacle 110 at a point B on the curved section 120-2, as shown in FIG. 1B, and align the receptacle 110 perpendicularly to the curved section 120-2, then the user will be required to perform some additional steps. In this context, aligning the receptacle 110 perpendicularly to the curved section 120-2 at the point B means aligning the receptacle 110 perpendicularly to a tangent line 130. Using the prior art CAD program, the user has to either manually identify the appropriate angle to rotate the receptacle 110 by or manually rotate the receptacle based on visual inspection. To illustrate, suppose an angle $\theta$ is the angle between the initial placement of the receptacle 110 at the point B and the tangent line 130. In one approach, the user relies on the functions supported by the prior art CAD program to identify the angle $\theta$, calculate the difference between the angle $\theta$ and ninety (90) degrees, and then rotate the receptacle 110 by this difference in a counter-clockwise manner. In another approach, the user may interact with the graphical user interface of the prior art CAD program to iteratively rotate the receptacle 110 from its initial position until the user visually determines that the intended alignment has been achieved.

Figure 2:
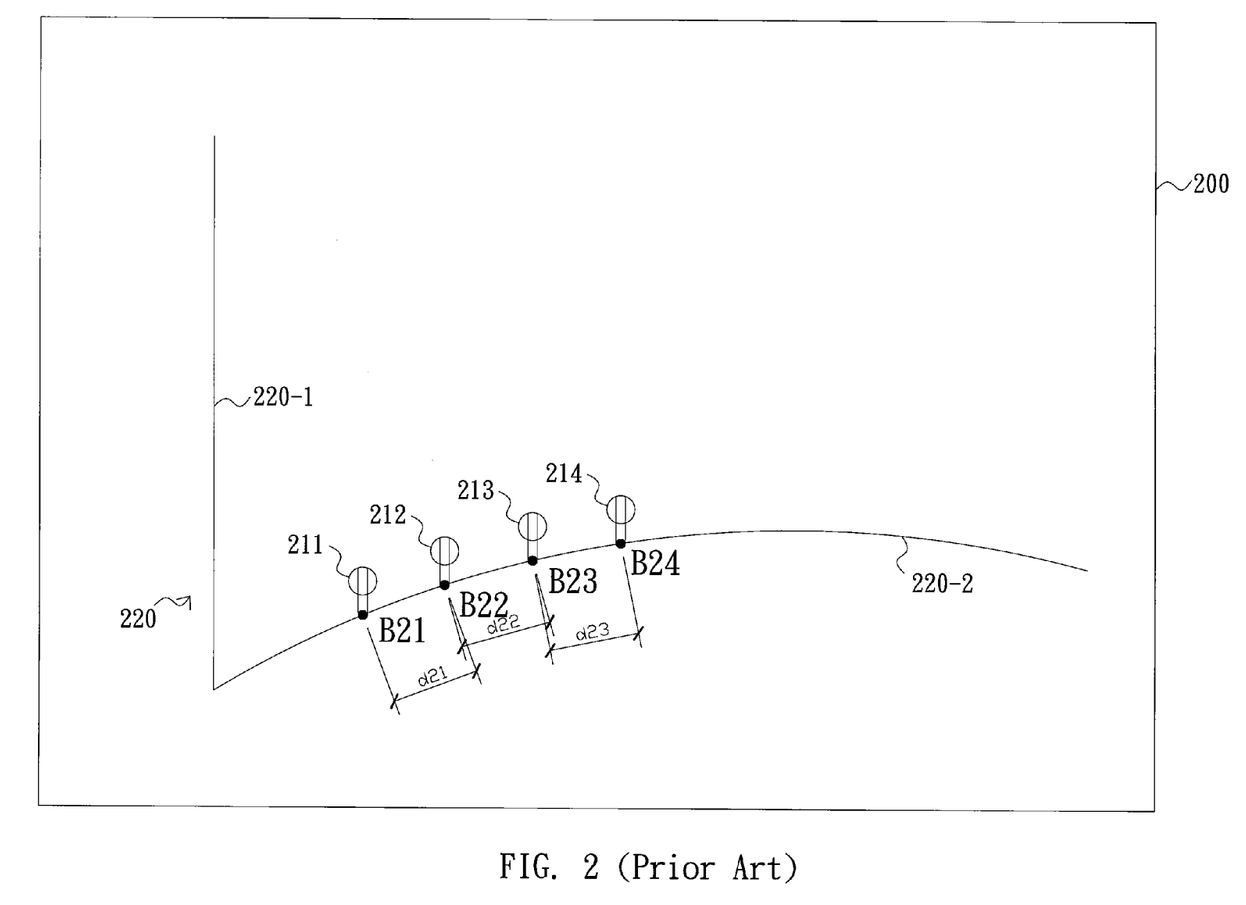
FIG. 2 is a schematic diagram of prior art approaches of adding, placing, and aligning four receptacles in a viewing screen of a CAD drawing.

As has been demonstrated, the prior art CAD program requires its user to perform certain operations manually to add, place, and align a drawing element. If a CAD drawing includes more drawing elements, then more manual operations are required. As the number of manual operations increases, the results become less consistent and precise. FIG. 2 is a schematic diagram of prior art approaches of adding, placing, and aligning four receptacles in a viewing screen 200 of a CAD drawing. The four receptacles 211, 212, 213, and 214 are placed at points B21, B22, B23, and B24 on the curved section 220-2 of a wall 220. Here, using the prior art CAD program, a user must perform the steps detailed above four times. Repeating the manual operations multiple times invites errors and inefficiencies.

Moreover, because the prior art CAD program does not enforce or check how the drawing elements are laid out pursuant to any construction standards (e.g., a regulation specifying maximum permissible distance between two electrical devices), design professionals also need to manually verify and potentially modify the resulting layout. Referring again to FIG. 2, the intervals between two neighboring receptacles are d21, d22, and d23. Using the prior art CAD program, a user places one receptacle at a time (e.g., the receptacle 211), designates the interval (e.g., d21) to place the next receptacle (e.g., the receptacle 212), and places the next receptacle. If the user is unaware of the maximum permissible distance between the two receptacles as specified by some applicable building standard or code, the initially specified interval d21 may need to be subsequently modified to conform to such standards. Also, because the four receptacles are placed on the curved section 220-2 and not on a straight section (e.g., section 220-1), the user has to rely on functions supported by the prior art CAD program to either calculate the distance of each interval or estimate the distance by visual inspection.

As the foregoing illustrates, there is a need in the art to provide a method and system for automatically aligning and laying out drawing elements in a CAD drawing that is more efficient and precise than prior art techniques.

SUMMARY OF THE INVENTION

Embodiments of the invention include a method for aligning and laying out drawing elements in a computer-aided design drawing and computer-readable medium storing instructions for implementing the method. Specifically, one embodiment of the present invention sets forth a method, which includes the steps of receiving a selection of an insertion point on an object within the CAD drawing, where the drawing element attaches to the object at the insertion point, placing the drawing element at the insertion point, and orienting the drawing element at a predetermined alignment angle relative to the object.

At least one advantage of the present invention disclosed herein is the ability to enable a user to precisely and efficiently manipulate, place, and align multiple drawing elements in a computer-aided design drawing, especially for residential and commercial developments.

DETAILED DESCRIPTION OF THE PREFERRED EMBODIMENTS

Figure 3:
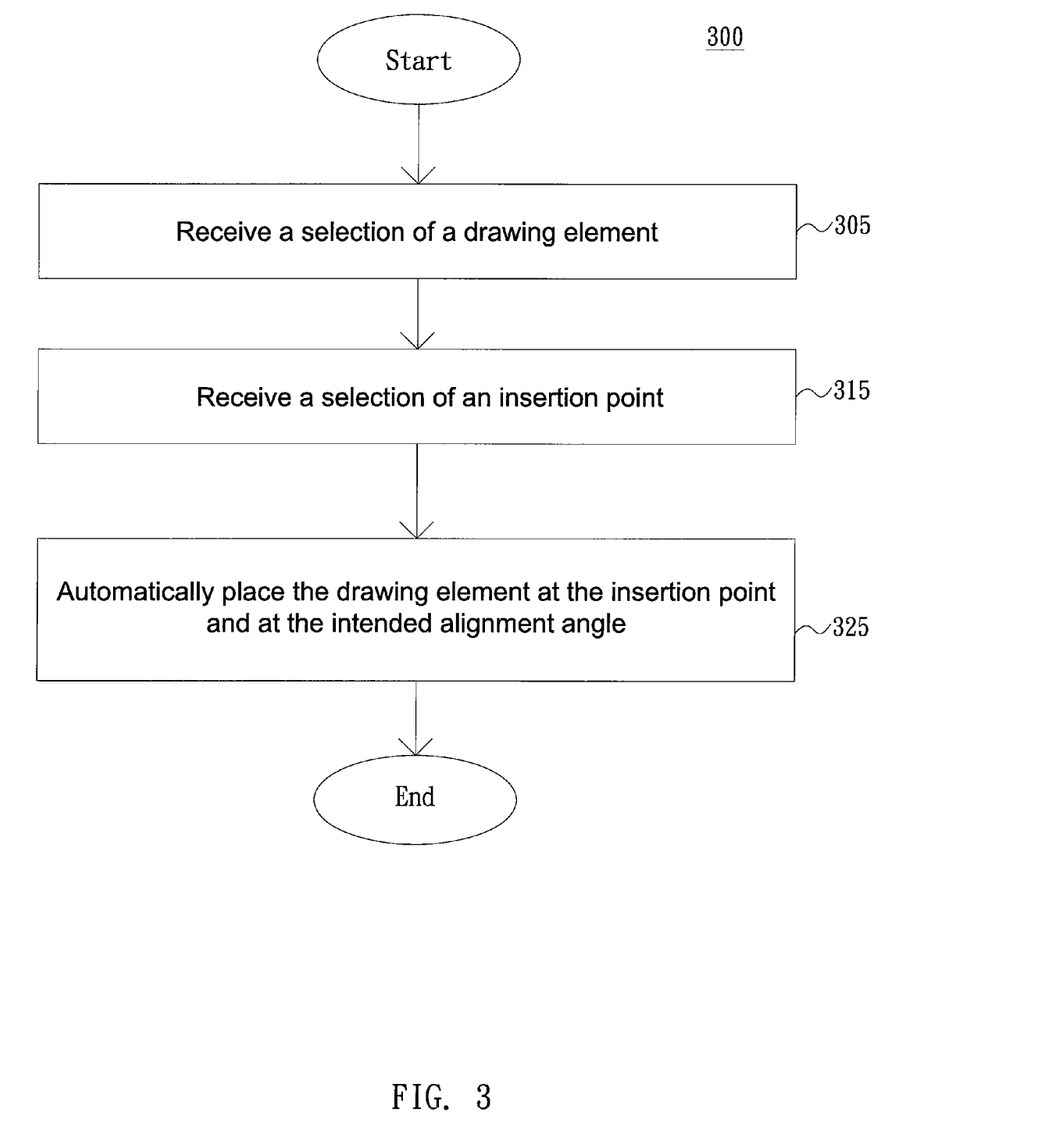
FIG. 3 is a flowchart illustrating a process for aligning a drawing element in a CAD drawing, according to one embodiment of the present invention.

Embodiments of the present invention provide a method and system for aligning and laying out a drawing element with respect to an object in a computer aided design (CAD) drawing. FIG. 3 is a flowchart illustrating a process 300 for aligning a drawing element in a CAD drawing, according to one embodiment of the present invention. Persons skilled in the art will understand that any system configured to perform the steps of method 300, in any order, is within the scope of the present invention.

At step 305, a CAD application program implementing one embodiment of the present invention receives a user-selected drawing element. Examples of a drawing element include, without limitation, an electrical device, a light fixture, or a receptacle (e.g., an electric socket, a telephone jack, or a network port). This drawing element can be a new element to be added in a CAD drawing or an existing element to be manipulated in the CAD drawing. At step 315, the system receives a user-designated insertion point to place the drawing element. The insertion point can be a point on an object, such as, without limitation, a point on a line, an arc, a wall, or a ceiling grid. At step 325, the system automatically (i.e., without any further intervention from the user) places the drawing element at the insertion point at an intended alignment angle, which is measured relative to the object containing the insertion point. In one implementation, before the actual placement of the drawing element, the system has obtained the following information: (1) the identity of the user-selected drawing element, (2) the location of the drawing element, (3) the user-designated insertion point, and (4) the intended alignment angle. Note, the system may accept a user-specified angle or may be configured with a predetermined value, such as a right angle.

Figure 4:
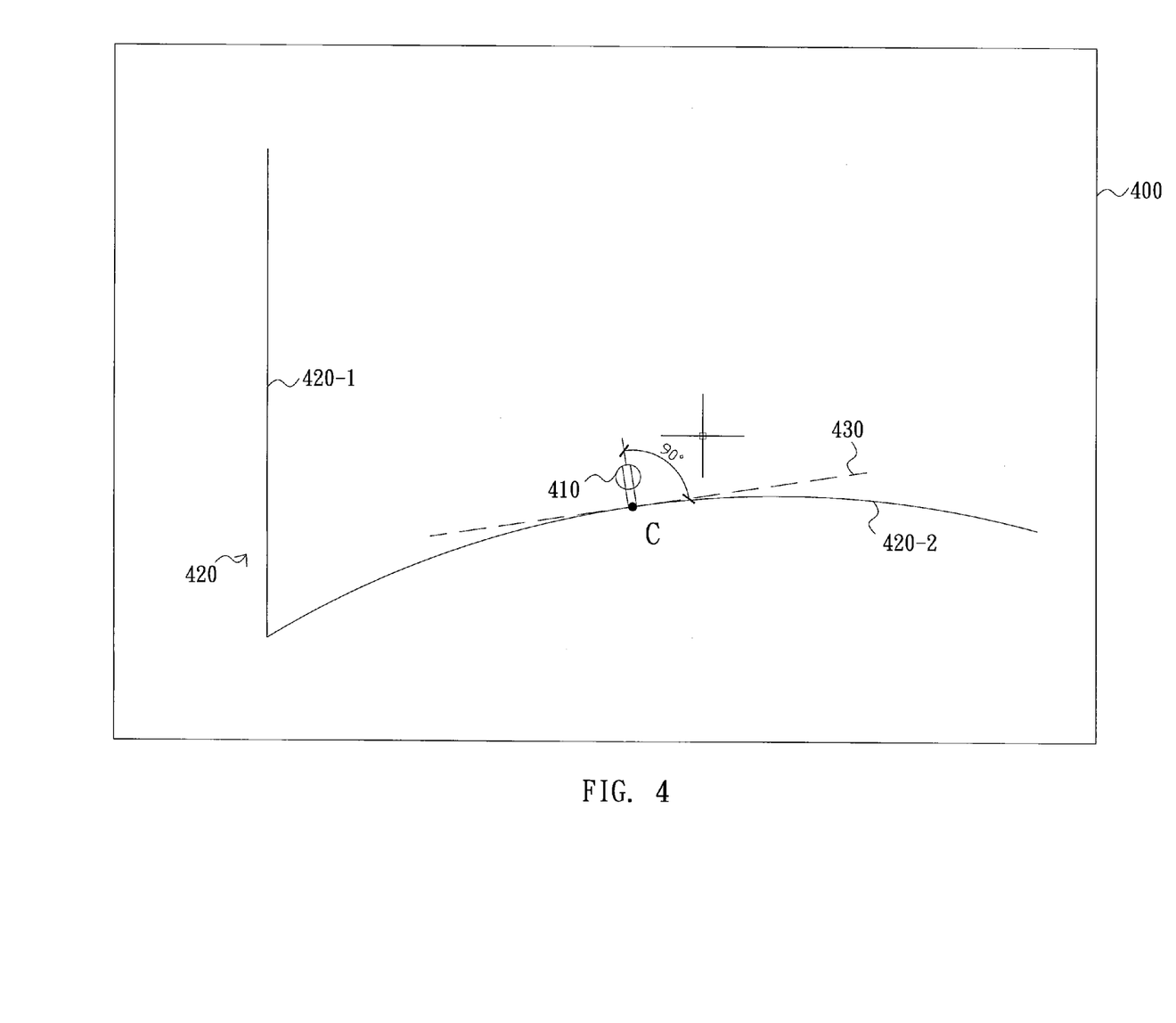
FIG. 4 is a schematic diagram illustrating the attachment and alignment of a drawing element to a wall in a viewing area of a CAD drawing, according to one embodiment of the present invention.

FIG. 4 is a schematic diagram illustrating the attachment and alignment of a drawing element 410 to a wall 420 in a viewing area 400 of a CAD drawing, according to one embodiment of the present invention. As shown, wall 420 includes a straight section 420-1 and a curved section 420-2. In conjunction with FIG. 3, suppose a user selects the drawing element 410 in step 305 and, in step 315, designates a point C on the curved section 420-2 of the wall 420 as the insertion point. Suppose further that the intended alignment angle is predetermined to be ninety (90) degrees. When the user directs the drawing element 410 towards the point C by moving the cross sign shown in FIG. 4, in one implementation, the object nearest the cross sign is identified. Here, the nearest object is the curved section 420-2. Without any input from the user, a tangent line 430 is calculated based on the designated insertion point C and the identified curved section 420-2. With the tangent line 430, the drawing element 410 then precisely snaps to the point C at the intended right angle. The user neither needs to manually calculate an angle to further adjust the drawing element 410 by nor needs to rely on visual inspection to manually rotate the drawing element 410 to achieve the intended alignment. It should be noted that the drawing element 410 may be a copy of an existing drawing element in the CAD drawing. In other words, the steps described above apply not only to a newly added drawing element to a CAD drawing but also to one or more copies or instances of an existing drawing element.

Figure 5:
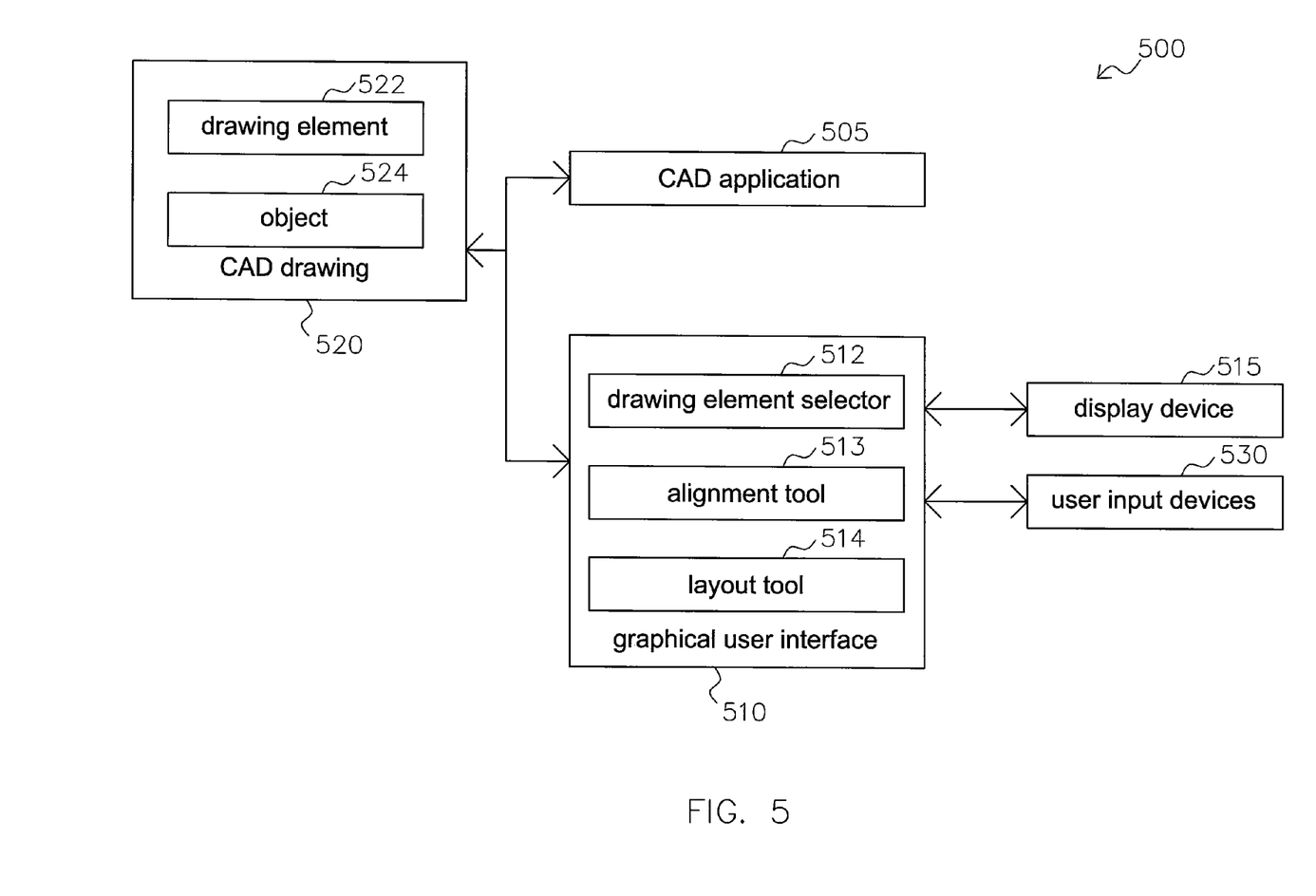
FIG. 5 is a block diagram illustrating components of a system used to implement one embodiment of the present invention.

FIG. 5 is a block diagram of a system 500 configured for performing the method steps described above, according to one embodiment of the invention. The components illustrated in the system 500 may include computer software applications executing on existing computer systems, e.g., desktop computers, server computers, laptop computers, tablet computers, and the like. The software applications described herein, however, are not limited to any particular computing system and may be adapted to take advantage of new computing systems as they become available.

Additionally, the components illustrated in the system 500 may be implemented as software applications that execute on a single computer system or on distributed systems communicating over computer networks such as local area networks or wide area networks, such as the Internet. For example, a graphical user interface (GUI) 510 may include a software program executing on a client computer system at one physical location and communicating with a CAD application 505 executing at another physical location. Also, in one embodiment, the programming instructions of the CAD application 505 and the GUI 510 may be stored on computer readable media such as a CD-ROM, DVD-ROM, flash memory module, or other tangible storage media.

As shown, the system 500 includes, without limitation, the CAD application 505, the GUI 510, a CAD drawing 520, user input devices 530, and a display device 515. The CAD application 505 is configured to allow a user to compose or select a CAD drawing 520 via the GUI interface 510. Accordingly, the CAD application 505 and the GUI interface 510 may include programmed routines or instructions enabling the user to create, edit, load, and save the CAD drawing 520. In one embodiment, the Autodesk® Inventor™ application program (and associated utilities) may be used. Those skilled in the art will recognize, however, that the components shown in FIG. 5 are simplified to highlight aspects of the present invention and that a typical CAD application and a GUI interface may include additional tools and features.

The CAD drawing 520 includes a drawing element 522 and an object 524. Some examples of the drawing element 522 and the object 524 are discussed throughout this disclosure. In one embodiment, the GUI 510 includes a drawing element selector 512, an alignment tool 513, and a layout tool 514. The drawing element selector 512 of the GUI 510 allows a user of the CAD application 505 to select the drawing element 522 to add, move, or copy in the CAD drawing 520. The alignment tool 513 allows the user to specify certain parameters for carrying out the automatic alignment, according to one embodiment of the present invention. For example, suppose the drawing element 522 is selected to be attached to the object 524 in the CAD drawing 520. The alignment tool 513 provides an input interface for the user to designate an intended alignment angle between the selected drawing element 522 and the object 524. In addition, the alignment tool 513 also allows the user to either turn on or turn off the automatic alignment feature associated with the selected drawing element 522. The layout tool 514 also provides an input interface for the user to specify a layout rule. For instance, the layout rule may include, without limitation, a number of drawing elements to populate the space, and the distance between any two drawing elements. The user defines the rules in the interface and then selects a point in the drawing. Item(s) are then placed in the CAD drawing based on the layout rule.

Similar to the alignment tool 513, the layout tool 514 also allows the user to either enable or disable applying the layout rule to a designated group of drawing elements. Additionally, the layout tool 514 supports various "group" functions, allowing a user of the CAD application 505 to select and manipulate a group of drawing elements at the same time. It should be apparent to a person with ordinary skills in the art to recognize that the aforementioned components in the GUI 510 can be combined or reorganized in a variety of ways.

Figure 6:
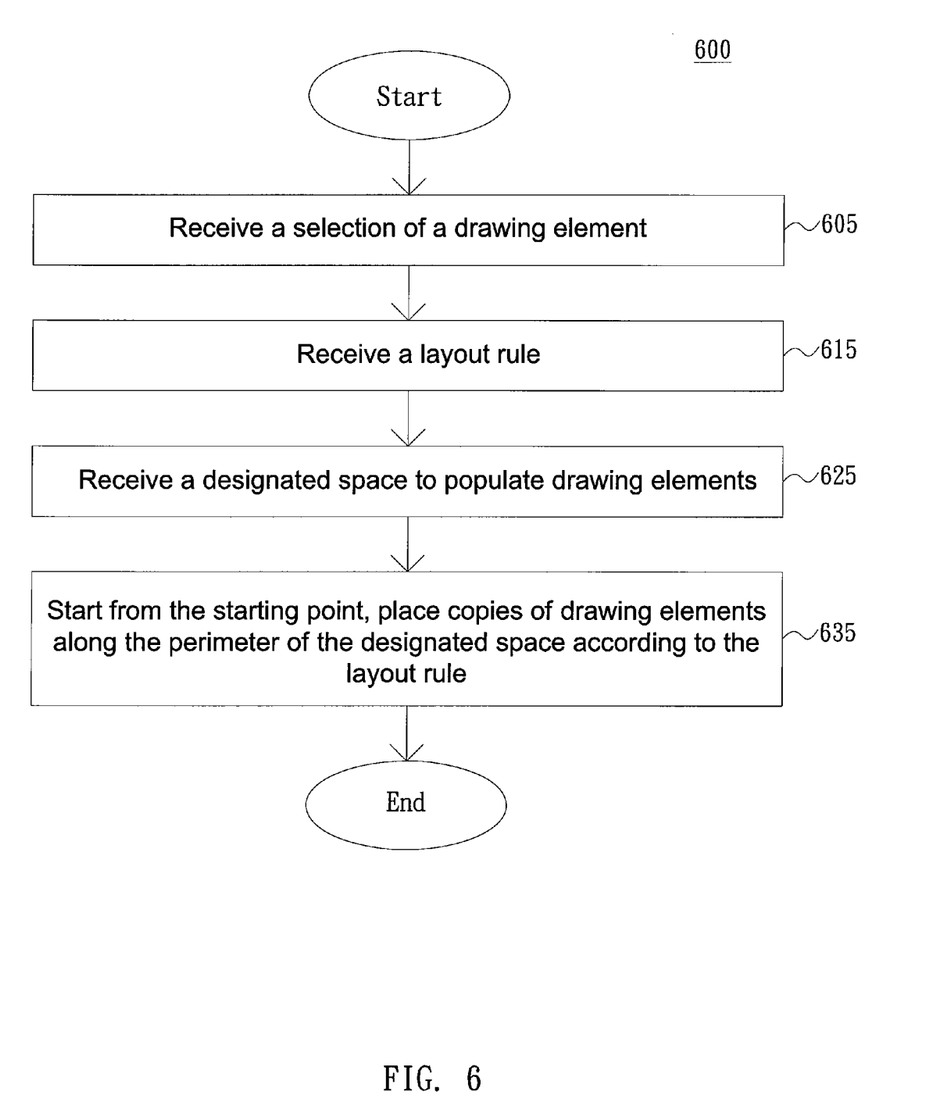
FIG. 6 is a flowchart illustrating a process for laying out drawing elements in a CAD drawing, according to one embodiment of the present invention.

FIG. 6 is a flowchart illustrating a method 600 for laying out drawing elements in a CAD drawing, according to one embodiment of the present invention. Although described in conjunction with the system 500 shown in FIG. 5, persons skilled in the art will understand that any system configured to perform the steps of method 600, in any order, is within the scope of the present invention. At step 605, the system 500 receives the selected drawing element at step 605. For example, a user may interact with GUI 512 and drawing element selector 512. At step 615, the system 500 receives a layout rule, which may include a number of different parameters such as, without limitation, a starting point to place the drawing element, or a number of instances of the drawing element to place in a designated space, or a maximum permissible distance between any two drawing elements according to an applicable building standard or building code. For example, in the U.S., the National Electrical Code (NEC) may be used. At step 625, system 500 receives the designated space and then populates the instances of the selected drawing element along the perimeter of the designated space at a step 635. In one implementation, the drawing elements are spaced evenly along the perimeter. More specifically, the system 500 first calculates the length of the perimeter and then divides the length evenly among the number of drawing elements to be positioned. In another implementation, the user specifies a particular distance for any two drawing elements in the layout rule, and this specified distance is used to place the drawing elements, according to the distance specified by the user.

Figure 7A:
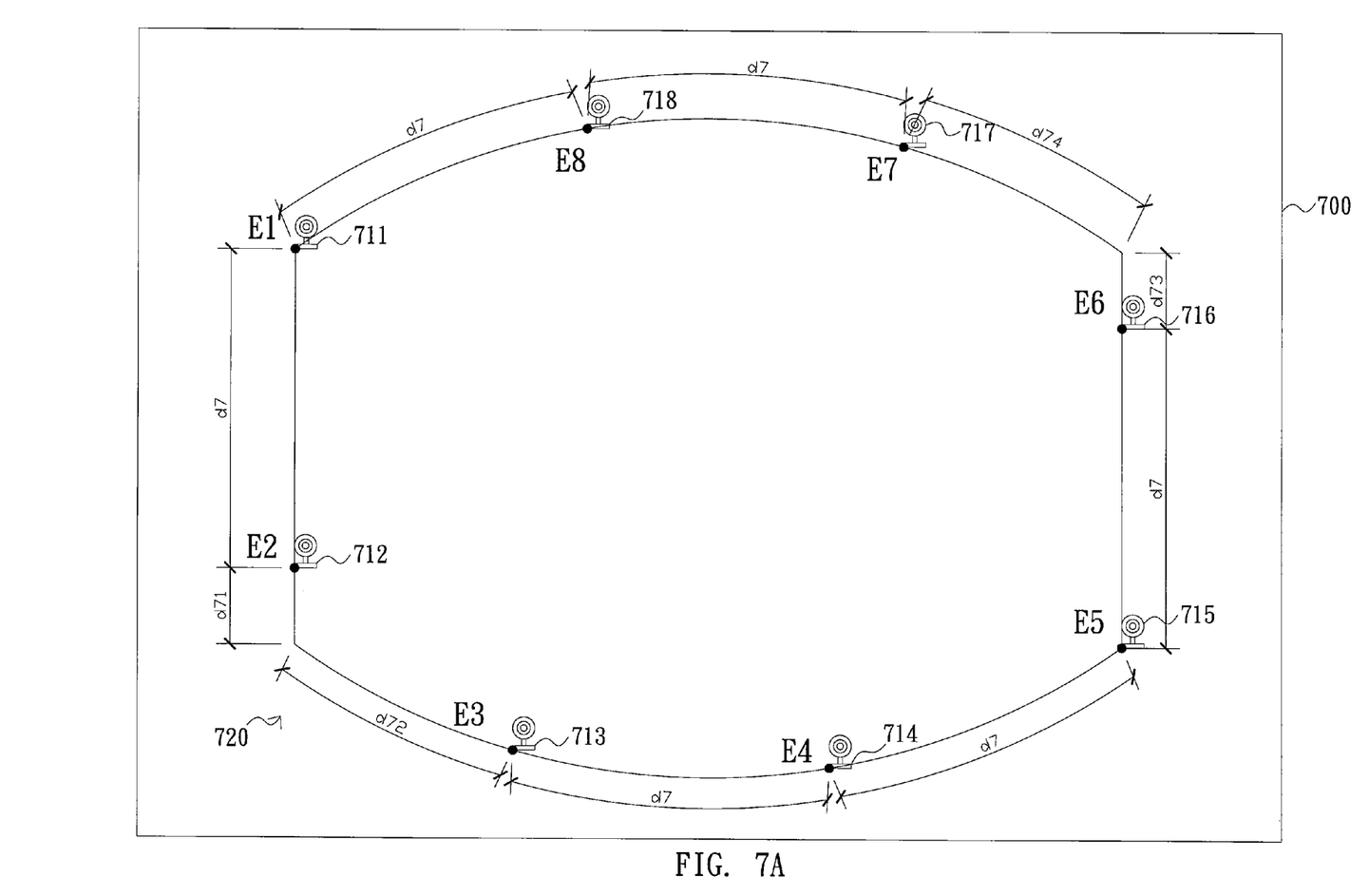
FIG. 7A is a viewing area of a CAD drawing illustrating the layout of multiple drawing elements, according to one embodiment of the present invention.

To illustrate, FIG. 7A is a viewing area 700 of a CAD drawing illustrating the layout of multiple drawing elements, according to one embodiment of the invention. Here, suppose a user of the system 500 selects to add drawing elements representing a light fixture 711 in the viewing area 700. Suppose the user also designates a starting point to insert the light fixture 711 at a point E1 and specifies eight (8) light fixtures in a layout rule. After the system 500 receives the designated space to populate the light fixtures, which in this case is a wall 720 within the viewing area 700, the system 500 calculates the perimeter of the wall 720, taking into consideration of the two straight sections and the two curved sections. As the user directs the selected light fixture 711 towards the E1 point, the system 500 causes the light fixture 711 to snap to the E1 point and also place the other seven light fixtures, 712, 713, 714, 715, 716, 717 and 718, along the perimeter of the wall 720 equidistantly at the points E2, E3, E4, E5, E6, E7 and E8, respectively, from one another. In this example, the distance between any two light fixtures to equal the length of the perimeter divided by 8 and is denoted as d7. Even for the two light fixtures that attach to the two different sections of the wall 720, such as the light fixtures 712 and 713 or the light fixtures E6 and E7, the distance between the two pairs, the sum of d71 and d72 or the sum of d73 and d74, still equals d7.

Alternatively, the user may specify the length of d7 in the layout rule, and instead of calculating d7 based on the length of the perimeter of the wall 720, the system 500 lays out the light fixtures based on the specified length. In one implementation, the system 500 also proactively verifies whether any layout violates a requirement imposed by any standardized code tracked by the system (e.g., building regulations for new construction). For instance, if d7 exceeds the maximum permissible distance, then the system 500 suspends the layout operation and alerts the user of the violation, so the user can modify the layout rule accordingly. It should be apparent to person ordinarily skilled in the art to implement this verification mechanism at various points of the process 600 without exceeding the scope of the present invention. For example, the verification may take place at the step 615 after the user specifies certain parameters in the layout rule, such as the length between any two drawing elements. So, if the specified values violate the applicable building code or regulation, then the user is prompted to enter new values. In another implementation, the verification may take place at the step 635 as the system 500 attempts to populate the drawing elements.

Figure 7B:
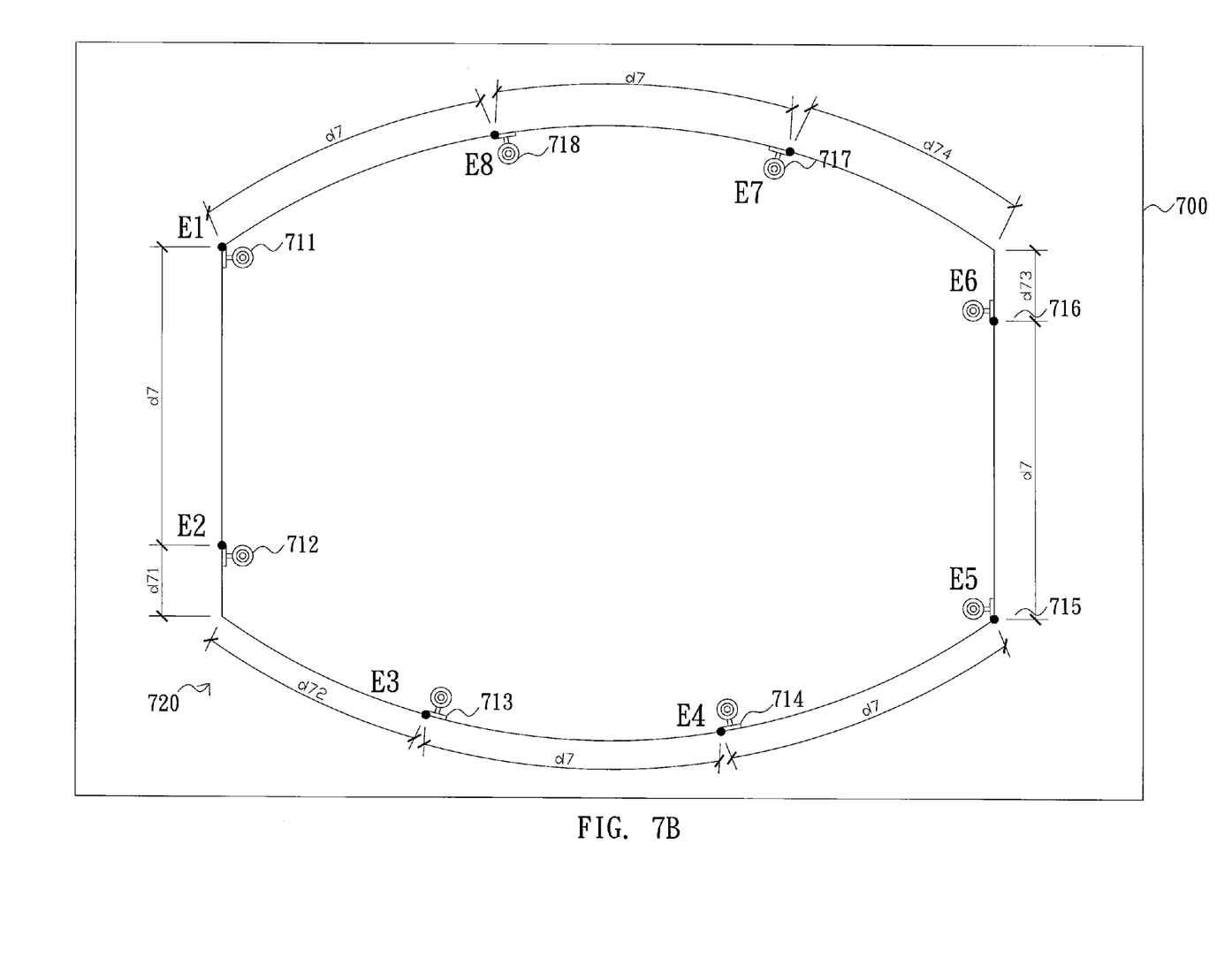
FIG. 7B is the viewing area illustrating the alignment of the laid out drawing elements shown in FIG. 7A, according to one embodiment of the present invention.

Moreover, in addition to the rule-based approach of laying out the drawing elements, the system 500 also automatically align the drawing elements as discussed in the process 300 above. FIG. 7B is the viewing area 700 illustrating the alignment of the laid out drawing elements shown in FIG. 7A, according to one embodiment of the present invention. Again, it is worth noting that the alignment of the eight fixtures does not involve any manual adjustments by the user.

As mentioned above, the layout tool 514 in the GUI 510 may support one or more grouping functions. For example, during the initial placement of items, the user may receive a preview based on the rule values and can then change them in the rule if they do not like the preview. After the user selects an initial insertion point, all items are placed in the drawing and then may thereafter be manually edited one-by-one. Further, in one embodiment the placed items may be group-selectable. So, if the user intends to move, copy, or otherwise manipulate a number of drawing elements at once, these grouping functions allow the user to select two or more items and perform the same operation to multiple drawing elements at the same time. For example, if the user wants to move the light fixtures 712, 713, and 714 shown in FIG. 7B in a group to another viewing area with a new object, these light fixtures will automatically be placed at a distance d7 from each another and will be automatically aligned to the perimeter of the new object. On the other hand, if the user selects the light fixtures 713, 714, and 715 shown in FIG. 7B and wants to modify the distances among them in a group, then the user only needs to modify one distance, for example, distance between the light fixtures 713 and 714. The modification automatically applies to the distance between the light fixtures 714 and 715.

While the foregoing is directed to embodiments of the present invention, other and further embodiments of the invention may be devised without departing from the basic scope thereof, and the scope thereof is determined by the claims that follow.

What is claimed is:

1. A computer-implemented method for aligning a drawing element in a computer-aided design (CAD) drawing, the method comprising:
   receiving a selection of an insertion point on an object within the CAD drawing,
      wherein the drawing element attaches to the object at the insertion point; placing the drawing element at the insertion point;
   establishing a tangent line based on the insertion point on the object;
   orienting the drawing element at a predetermined alignment angle relative to the tangent line; and
   populating instances of the drawing element within a designated space according to parameters specified in a layout rule.

2. The method of claim 1, further comprising snapping the drawing element to the insertion point at the predetermined alignment angle relative to the object as the drawing element is directed near the insertion point.

3. The method of claim 1, wherein the parameters include a number of the instances of the drawing element to populate into the designated space.

4. The method of claim 1, wherein the parameters include a requirement of a standardized code.

5. The method of claim 4, further comprising monitoring whether the populating step conforms to the requirements of the standardized code.

6. The method of claim 1, further comprising:
   calculating a length of the perimeter of the designated space; and
   disposing instances of the drawing element along the perimeter based on the initial position and the length of the perimeter.

7. The method of claim 6, wherein the disposing step is further based on a specified length in the layout rule.

8. The method of claim 1, further comprising:
   selecting a set of the instances of the drawing element as a group; and
   performing an action to one of the instances in the group, wherein the action applies to the remaining instances in the group.

9. A computer-readable storage medium storing instructions for aligning a drawing element in a computer-aided design (CAD) drawing, which when executed by a processing unit in a computing device, causes the processing unit to perform the steps of:
   receiving a selection of an insertion point on an object within the CAD drawing,
      wherein the drawing element attaches to the object at the insertion point; placing the drawing element at the insertion point;
   establishing a tangent line based on the insertion point on the object;
   orienting the drawing element at a predetermined alignment angle relative to the tangent line; and
   populating instances of the drawing element within a designated space according to parameters specified in a layout rule.

10. The computer-readable storage medium of claim 9, further comprising instructions for snapping the drawing element to the insertion point at the predetermined alignment angle relative to the object as the drawing element is directed near the insertion point.

11. The computer-readable storage medium of claim 9, wherein the parameters include a number of the instances of the drawing element to populate into the designated space.

12. The computer-readable storage medium of claim 9, wherein the parameters include a requirement of a standardized code.

13. The computer-readable storage medium of claim 12, further comprising instructions for monitoring whether the populating step conforms to the requirements of the standardized code.

14. The computer-readable storage medium of claim 9, further comprising instructions for:
   calculating a length of the perimeter of the designated space; and
   disposing instances of the drawing element along the perimeter based on the initial position and the length of the perimeter.

15. The computer-readable storage medium of claim 14, wherein the disposing step is further based on a specified length in the layout rule.

16. The computer-readable storage medium of claim 9, further comprising instructions for:
   selecting a set of the instances of the drawing element as a group; and
   performing an action to one of the instances in the group, wherein the action applies to the remaining instances in the group.

17. A method for laying out a plurality of drawing elements in a computer-aided design (CAD) drawing, the method comprising:
   specifying a layout rule; and
   placing one of the plurality of drawing elements at an initial position within the CAD drawing specified in the layout rule;
   invoking a layout tool configured to populate the remaining of the plurality of the drawing elements in a designated space according to the layout rule.

18. The method of claim 17, wherein the layout tool is further configured to orient each of the plurality of drawing elements at a predetermined alignment angle relative to an object in the designated space.

19. A computing device, comprising:
   a processing unit; and
   a memory system configured to store instructions for aligning a drawing element in a computer-aided design (CAD) drawing, which when executed by the processing unit, causes the processing unit to perform the steps of:
   receiving a selection of an insertion point on an object within the CAD drawing, wherein the drawing element attaches to the object at the insertion point;
   placing the drawing element at the insertion point;
   establishing a tangent line based on the insertion point on the object;
   orienting the drawing element at a predetermined alignment angle relative to the tangent line; and
   populating instances of the drawing element within a designated space according to parameters specified in a layout rule.

* * * * *